(12) United States Patent
Engelhardt et al.

(10) Patent No.: US 6,483,160 B2
(45) Date of Patent: Nov. 19, 2002

(54) MICROMECHANICAL ENCLOSURE

(75) Inventors: Albert Engelhardt, Munich (DE);
Bernhard Hartmann, Munich (DE);
Ulrich Prechtel, Munich (DE); Helmut Seidel, Starnberg (DE)

(73) Assignees: DaimlerChrysler AG, Stuttgart (DE);
Temic Telefunken microelectronic GmbH, Nuremberg (DE)

( * ) Notice: Subject to any disclaimer, the term of this patent is extended or adjusted under 35 U.S.C. 154(b) by 0 days.

(21) Appl. No.: 09/909,030

(22) Filed: Jul. 19, 2001

(65) Prior Publication Data

US 2002/0008317 A1 Jan. 24, 2002

(30) Foreign Application Priority Data

Jul. 21, 2000 (DE) .......................... 100 35 564

(51) Int. Cl.⁷ .......................... H01L 29/82; H01L 29/06
(52) U.S. Cl. .................. 257/415; 257/417; 257/419; 257/420; 257/619
(58) Field of Search .................. 257/415, 416, 257/417, 418, 419, 420, 619, 724, 700, 701, 758, 710, 691, 786; 438/50, 52, 53, 118, 107, 459, 456, 977, 14; 73/514.16

(56) References Cited

U.S. PATENT DOCUMENTS 4,802,952 A 2/1989 Kobori et al.
5,532,187 A * 7/1996 Schreiber-Prillwitz et al. ... 438/
5,668,033 A 9/1997 Ohara et al.

FOREIGN PATENT DOCUMENTS

| DE | 19619921 | 12/1996 |
| EP | 0369352 | 5/1990 |
| EP | 0773443 | 5/1997 |
| JP | 6-308150 | * 4/1994 |

OTHER PUBLICATIONS

Raji Krishnamoorthy Mali et al.; "A design–based approach to planarization in multilayer surfae micromachining"; Journal Micromech. Microeng. 9; 1999, pp. 294 to 299.

* cited by examiner

Primary Examiner—Minh Loan Tran
Assistant Examiner—Tan Tran
(74) Attorney, Agent, or Firm—W. F. Fasse; W. G. Fasse

(57) ABSTRACT

A micromechanical enclosure suitable for micromechanical sensors, particularly acceleration sensors in the field of automotive vehicles, includes a micromechanical structure on a substrate, a conductor track layer connected to the micromechanical structure on the main surface of the substrate, a cover that covers a part of the main surface of the substrate, and a level compensation layer arranged next to the conductor track layer beneath the contact area during the manufacture of the wafer. A planarizing layer, which forms a level surface, may additionally be applied above this, to form a level area on the substrate which can easily be joined to a level area of the cover by means of a metallic wafer bond. This achieves small overall dimensions and avoids a glass frit bond.

10 Claims, 2 Drawing Sheets

MICROMECHANICAL ENCLOSURE

The present invention relates to a micromechanical enclosure, for enclosing a micromechanical sensor, for example.

BACKGROUND OF THE INVENTION

Previous micromechanical enclosures consist of a substrate which contains a micromechanical structure, and which has conductor tracks that are linked, for example, to an external evaluation circuit for evaluating signals. The sensitive part of such an arrangement has to be protected from environmental influences, particularly moisture and dust, by a cover. This cover must be joined to the substrate element in such a manner that a sealed joint results, above all at those positions where the conductor tracks are run from the covered area to the uncovered area. The sealing of the sensitive part of the substrate by a cover is generally achieved by means of micromechanical enclosures in which two wafers are bonded to each other, and in which one wafer has a plurality of identical components with the micromechanical structure, and the other wafer forms the covers, so that a composite wafer is formed through bonding. Separating such a composite wafer produces single components which are already located in hermetically sealed enclosures. Glass frits, which are arranged in a ring-shape on the cover or around the part of the substrate that is to be covered, and which are melted during the joining of the two wafers, are frequently used as a bonding material between the two wafers. This glass frit bond has a thickness of around 50 $\mu$m to 100 $\mu$m and a width of around 500 $\mu$m. The thickness of its structure has a level compensating effect as the height of the substrate structure varies along the joint. Furthermore, it effects electrical insulation between cover and substrate.

The disadvantage of such an assembly is that a great deal of space is required for the cover connection, and this often exceeds the space required by the useful element. Moreover, glass frit bonding is complicated, and the components are afflicted with a high stress factor as a result of the differing coefficients of expansion and the relatively thick layers. It is practically impossible to set a precise spacing to the cover wafer for inserting counter electrodes.

A capacitive sensor is disclosed in EP 0 773 443 B1, in which two semiconductor wafers are joined by means of a metallic wafer bond. This wafer bond is a thin metallic soldered joint with a low space requirement. Such metallic layers can be applied to the wafers by known and conventional manufacturing processes. The disadvantage with this is that no means is provided of dielectrically insulating the lead-through of the conductor tracks.

In the publication "A design-based approach to planarization in multilayer surface micromachining" by Raji Krishnamoorthy Mali, Thomas Bifano, David Koester in the Journal Micromech. Microeng. 9 (1999); p. 294 to p. 299, a planarizing method is disclosed, which enables the distance between two layers lying next to each other to be reduced.

SUMMARY OF THE INVENTION

The object of the invention is to provide a micromechanical enclosure which has small dimensions and which can be simply and reliably manufactured without requiring additional and complex processing steps.

This object of the invention is achieved in a micromechanical enclosure by the special features of the invention. According to the invention, at least in the area of the contact surface, which is formed between the cover and the main surface, a level compensation layer, which evens up the level beneath the contact surface to the desired height, is arranged in the same layer next to the conductor track layer.

The advantages achieved by the invention are the highly space-saving cover achieved by bonding two wafers, which together form a completely enclosed micromechanical sensor, for example on a silicon basis. The enclosure of the sensor is hermetically sealed. This type of wafer assembly enables a simple and reliable joining process which has a high yield of hermetically sealed, enclosed micromechanical sensors.

Advantageous further developments of the invention provide additional features. Here, the level compensation layer and the conductor track layer have at least the same structural height. Furthermore, it is advantageous if the level compensation layer and the conductor track layer are constructed from the same material in one working cycle. Furthermore, by providing an insulating planarizing layer, which fills the small gaps between the conductor track layer and the level compensation layer, above the level compensation layer and the conductor track layer, then a plane surface is created in the entire contact area between the main surface and the cover which, in turn, enables the cover to be easily mounted, and which hermetically seals the conductor track passage through the substrate. The dielectrically insulated conductor track passage also makes such an assembly suitable for capacitive sensors. Furthermore, if the lateral distance between the level compensation layer and the conductor track layer is less than double the thickness of the planarizing layer, then adequate planarizing can be achieved by merely cutting the layer off without any further process steps.

BRIEF DESCRIPTION OF THE DRAWINGS

The invention is described in more detail in the following with the aid of embodiments and figures. They show.

DESCRIPTION OF THE PREFERRED EMBODIMENTS

Figure 1:
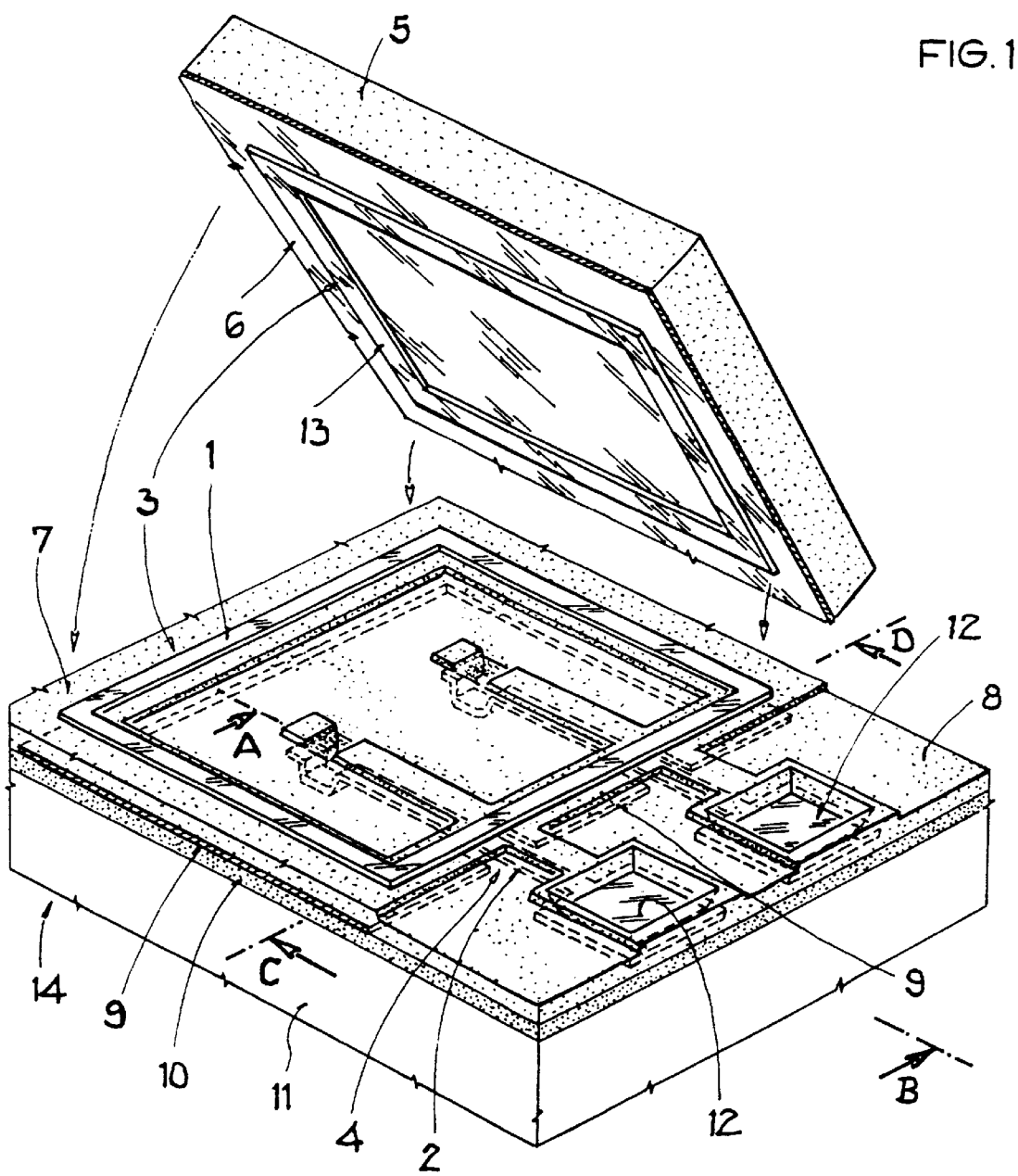
FIG. 1: Diagram of a micromechanical enclosure.

FIG. 1 shows a micromechanical enclosure comprising a lower part—the substrate 14—and the cover 5. These parts are originally located on a substrate wafer and a cover wafer upon which wafers a plurality of identical components are attached. The two wafers are bonded as described in the following for an individual component. They are then separated to create the individual enclosure shown in the figures. To make this clear, the individual components of the individual enclosure, which is actually closed, are shown separated from each other. The lower part—the substrate 14—largely comprises a silicon layer 11 in which the sensor structures, which are not shown, are arranged. An oxide layer 10 is applied to the silicon layer. The electrical signals from the sensor are led to the connection contacts 12 through conductor tracks 2 which run from the silicon layer 11 over the oxidation layer 10. For this purpose, a partial metal film, of aluminum for example, is applied to the oxide layer 10 which, on the one hand, forms the conductor track 2 and, on the other, a level compensation structure 9. The conductor track structure 2 is not in contact with the level compensation structure 9 at the passages 4 at which the conductor track 2 is run from the covered, hermetically sealed area to the connection contacts 12. The level compensation structure 9 is only formed at the positions over which the metallic bond ring 1 is formed to connect with the cover 5. A planarizing layer 8, which levels up the main surface 7 in the area of the bond ring 1 lying above, and levels up steps in the area of the conductor track passages 4, is located directly under the metallic bond ring 1, so that a plane surface area of the main surface 7 is formed under the bond ring 1. The main surface 7 of the assembly is the side surface of one wafer and/or the sensor which faces the cover 5. In this embodiment, the planarizing layer 8 is also an insulating layer which prevents the conductor track structure 2 and the level compensation structure 9 from contacting each other or the metallic bond ring 1. A further metal film 1, which forms the bond ring 1, is also located on the flat planarizing layer 8. This metallic bond ring 1 from the lower part 14 is connected to the metallic bond ring 13 on the cover 5. Bonded, they form a ring-shaped contact area 3 which forms a hermetically sealed joint. The assembly of the cover wafer and the cover 5 is made of silicon. A ring-shaped structure projects out of the silicon structure of the cover 5 on the side facing the substrate 14. The whole surface of the silicon structure is coated with metal 6, which serves to make the mechanical connection to the substrate 14 at the ring structure 13. This figure also shows the lines $\overline{AB}$ and $\overline{CD}$ which represent the sections in FIG. 2 and FIG. 3.

In another embodiment which is not shown, the conductor track and level compensation layers may consist of different materials, which are applied in different manufacturing processes. It may also prove to be advantageous in further embodiments for the level compensation layer to have a different structural height to that of the conductor track layer. Furthermore, the level compensation layer need not be continuously arranged, but may even have gaps which can, however, be compensated for by the planarizing layer.

Figure 2:
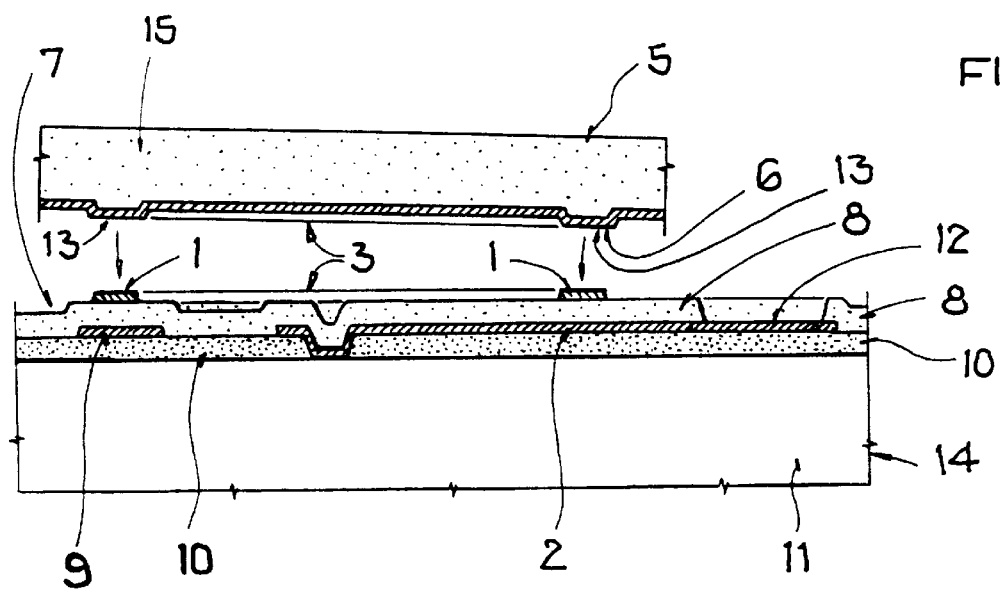
FIG. 2: First cross-sectional view of the micromechanical enclosure.

FIG. 2 shows a cross-sectional view along the line $\overline{AB}$ in FIG. 1. This diagram shows the section through a micromechanical enclosure along a conductor track 2. The lower part 14—the substrate—has a silicon layer 11 in which the micromechanical structures of the sensor are located. A first insulating layer 10, which primarily serves to insulate the conductor track from the silicon substrate, is located above the silicon layer 11. The conductor tracks 2 with the contacts 12 are formed on the insulating layer 10. A level compensation layer 9, which serves to even out differences in the level of the height of the assembly below the bond ring, and thus simplify the attachment of the cover 5 or the cover wafer, is arranged on the same level next to this conductor track structure 2. The conductor track structure 2 and the level compensation structure 9 are constructed from the same material, e.g. Al, in a single working cycle. An insulating layer 8, whose surface has a sealed, level, ring-shaped structure, is applied over the conductor track structure 2 and the level compensation structure 9. The bond ring 1, of aluminum for example, is arranged on this ring. The cover 5 is joined to this metallic bond ring 1 and protects the part of the main surface 7 of the substrate 14 which lies underneath it. A metal film 6 is applied to the whole surface of the cover 5 to join the cover 5 to the lower part 14, this metal film bonds at temperatures of 450° C. with the underlying bond ring 1 to a metal ring 3 which forms a hermetically sealed joint between the lower part 14 and the cover 5, and represents the contact area. In this embodiment, the cover has, on the underside, a ring-shaped structure 13 whose size matches the underlying ring-shaped structure, i.e. the bond ring 1, of the lower part 14. In an alternative embodiment which is not shown, the cover has a flat underside and does not have a ring-shaped elevation as in the illustrated embodiment. A metal film for bonding the semiconductor wafers or for forming the hermetically sealed joint between the cover and substrate is applied to the whole or part of the flat surface of the cover.

Figure 3:
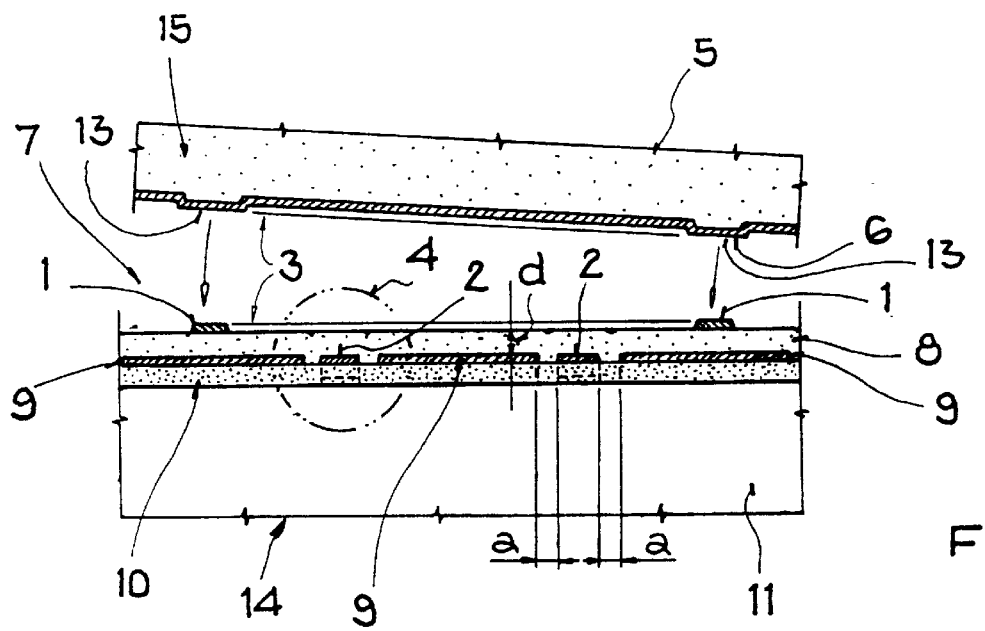
FIG. 3: Second cross-sectional view of the micromechanical enclosure.

FIG. 3 shows a cross-sectional view along the line $\overline{CD}$ in FIG. 1. This diagram shows a section through a micromechanical enclosure at right angles to the conductor track. As already described, the substrate 14 consists of a silicon structure 11 which has the sensor structures thereon. A first insulating layer 10, on which the conductor tracks are run from the silicon structure, is located above the silicon structure 11. On the insulating layer 10, level compensation layers 9 are arranged on the same level left and right of this conductor track structure 2. The level compensation layers 9 serve to even up differences in the level of the height of the assembly, and thus make the attachment of the cover easier. In the area of the passage 4 of the conductor tracks 2, the distance a between the level compensation layers 9 and the conductor track layer 2, which are arranged under the ring-shaped arrangement, must, on the one hand, be large enough so that no electrical contacts or other interactions occur between the two layers 9, 2, and, on the other hand, be small enough so that the gap with the width a is filled by the application of another planarizing layer 8, whereby the planarizing layer has a layer thickness d. The planarizing layer 8 has a flat surface in this cross-sectional view. This is always the case when the distance a is less than twice the thickness d of the planarizing layer 8. This planarizing layer 8, which also functions as an insulating layer, is arranged above the conductor track layer 2 and the level compensation layer 9. The plane surface of the planarizing layer 8 forms a closed, level, ring-shaped structure. In turn, the wafer bond layer 1 is arranged on this ring. The cover 5 is bonded to this layer 1 and thus protects the part of the main surface 7 which lies underneath. A layer 6, which bonds with the lower bond ring 1 at temperatures of 450° C. in the area of the cover ring 13, is applied to the whole surface of the cover to bond with the lower part 14 and the cover 5. In this embodiment, the cover 5 has, on the underside, a ring-shaped structure 13 whose size matches the ring-shaped structure, i.e. the bond ring 1, of the lower part 14 which lies underneath. In an alternative embodiment which is not shown, the cover 5 is plane on the underside. A metal film for bonding is applied to the whole or part of the plane surface of the cover. Small enclosure dimensions can be achieved with such an assembly. The height of the connecting elements required between substrate 14 and cover 5 is ca. 3 $\mu$m. Of this, ca. 0.5 $\mu$m to 1.5 $\mu$m is taken up by the planarizing layer 8, and ca. 2 $\mu$m by the hermetically sealed metal ring which forms the contact area 3.

In a further embodiment which is not shown, the planarizing layer is so thin that its surface is not plane beneath the contact area between substrate and cover, but only forms a level surface in conjunction with the layer lying above, e.g. the bond metal. The height of the assembly between the level compensation layer and conductor track layer at which a plane surface is achieved comprises two components here, these are the thickness of the planarizing layer and a portion of the thickness of the bond metal layer.

Furthermore, the cover may also have sensor structures which require an additional planarizing layer on the side of the cover.

Not only plane bonding levels can be constructed with such an assembly, which has level compensation and planarizing layers. Instead, the bonding levels may be on different levels in order to prevent the cover wafer and the substrate wafer from being joined incorrectly, for example.

Moreover, a level surface of the planarizing layer may be achieved not only by an appropriate height of the assembly, but also by a chemical, mechanical or chemical-mechanical polishing process.

What is claimed is:

1. Micromechanical enclosure comprising a substrate (14) having a main surface, a micromechanical structure on the main surface of the substrate, a cover (5) which covers at least a covered area of the main surface (7) of the substrate (14), at least one conductor track layer (2), which is connected to the micromechanical structure and which runs from the covered area out of the covered area of the main surface (7), and a level compensation layer (9) arranged in a same level next to the conductor track layer (2) under an entire contact area (3) at which the cover (5) contacts the main surface (7).

2. Micromechanical enclosure according to patent claim 1, wherein the thickness of the conductor track layer and the thickness of the level compensation layer (9) are the same.

3. Micromechanical enclosure according to patent claim 1 wherein the contact area includes aluminum.

4. Micromechanical enclosure according to patent claim 1 wherein the contact area includes germanium.

5. Micromechanical enclosure according to patent claim 1, wherein the material of the conductor track layer (2) is the same as the material of the level compensation layer (9).

6. Micromechanical enclosure according to patent claim 1, wherein a planarizing layer (8), which forms a plane surface below the contact area (3), is applied over the conductor track layer (2) and the level compensation layer (9).

7. Micromechanical enclosure according to patent claim 6, wherein the planarizing layer (8) has insulating properties and is an insulating layer.

8. Micromechanical enclosure according to patent claim 7, wherein the distance (a) between the conductor track layer (2) and the level compensation layer (9), which are arranged under the contact area (3), is less than twice the thickness (d) of the insulating layer (8).

9. Micromechanical enclosure according to patent claim 6, wherein the planarizing layer has a polished surface.

10. Micromechanical enclosure according to patent claim 1, wherein the thickness of the conductor track layer and the thickness of the level compensation layer are similar to one another.

* * * * *